United States Patent
Qi

(10) Patent No.: US 11,467,454 B2
(45) Date of Patent: Oct. 11, 2022

(54) ELECTRONIC PAPER DISPLAY SCREEN, DISPLAY DEVICE AND BONDING METHOD

(71) Applicants: Chengdu BOE Optoelectronics Technology Co., Ltd., Sichuan (CN); BOE TECHNOLOGY GROUP CO., LTD., Beijing (CN)

(72) Inventor: Mingchun Qi, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 422 days.

(21) Appl. No.: 16/610,713

(22) PCT Filed: Oct. 25, 2018

(86) PCT No.: PCT/CN2018/111773
§ 371 (c)(1),
(2) Date: Nov. 4, 2019

(87) PCT Pub. No.: WO2019/080884
PCT Pub. Date: May 2, 2019

(65) Prior Publication Data
US 2021/0157191 A1    May 27, 2021

(30) Foreign Application Priority Data
Oct. 27, 2017  (CN) .......................... 201711056143.4

(51) Int. Cl.
*G02F 1/1676* (2019.01)
*G02F 1/167* (2019.01)
*G02F 1/1345* (2006.01)

(52) U.S. Cl.
CPC ...... *G02F 1/13452* (2013.01); *G02F 1/13458* (2013.01); *G02F 1/167* (2013.01); *G02F 1/1676* (2019.01)

(58) Field of Classification Search
CPC .. G02F 1/13452; G02F 1/13458; G02F 1/167; G02F 1/1675; G02F 1/16753;
(Continued)

(56) References Cited

U.S. PATENT DOCUMENTS

| 2011/0242640 | A1 | 10/2011 | Lin | |
|---|---|---|---|---|
| 2016/0018715 | A1* | 1/2016 | Yan | G02B 1/14 359/296 |
| 2017/0176835 | A1* | 6/2017 | Gupta | G06F 3/0412 |

FOREIGN PATENT DOCUMENTS

| CN | 103559841 A | 2/2014 |
|---|---|---|
| CN | 103869572 A | 6/2014 |

(Continued)

*Primary Examiner* — Brandi N Thomas
(74) *Attorney, Agent, or Firm* — Myers Bigel, P.A.

(57) ABSTRACT

Embodiments of the disclosure provide an electronic paper display screen, a display device and a bonding method. The electronic paper display screen includes a substrate, the substrate including a display region and a bonding region on at least one side of the display region and adjacent to the display region, an electronic paper, the electronic paper being disposed in the display region and including an electronic ink conduction portion, the electronic ink conduction portion being at an edge of the electronic paper close to the bonding region and extending to the bonding region of the substrate, a bonding electrode disposed in the bonding region of the substrate, and a chip-on-film, the chip-on-film being electrically connected to the bonding electrode, and an end of the chip-on-film close to the display region being between the substrate and the electronic ink conduction portion.

20 Claims, 5 Drawing Sheets

(58) Field of Classification Search
CPC ............... G02F 1/1676; G02F 1/1685; G02F 1/133305; G02F 1/13613; G02F 1/1368; G03F 7/004; G03F 7/038; G03F 7/0045; G03F 7/039; G03F 7/031; G03F 7/0382; G03F 7/0385; G03F 7/0392; G03F 7/30

See application file for complete search history.

(56) References Cited

FOREIGN PATENT DOCUMENTS

| | | |
|---|---|---|
| CN | 105223754 A | 1/2016 |
| CN | 205982946 U | 2/2017 |
| CN | 107703693 A | 2/2018 |

\* cited by examiner

ELECTRONIC PAPER DISPLAY SCREEN, DISPLAY DEVICE AND BONDING METHOD

RELATED APPLICATION

The present application is a 35 U.S.C. 371 national stage application of a PCT International Application No. PCT/CN2018/111773, filed on Oct. 25, 2018, which claims the benefit of Chinese Patent Application No. 201711056143.4, filed on Oct. 27, 2017, the entire disclosure of which is incorporated herein by reference.

TECHNICAL FIELD

The present disclosure relates to the field of display technologies, and particularly to an electronic paper display screen, a display device and a bonding method.

BACKGROUND

An electronic paper display screen, also referred to as digital paper, is an ultra-thin, ultra-light display screen, which can be understood as "a thin, soft, and rewritable display like paper". Generally, display technologies that can achieve comfortable reading as paper, ultra-thinness, lightness, bendability, and ultra-low power consumption are called electronic paper technologies. Domestic and foreign research institutions and enterprises are actively conducting research on electronic paper because the electronic paper display screen has the characteristics of the paper, can display different images for content display, and has advantages such as low power consumption, foldable bending, fine display, wide viewing angle, good visual effect under sunlight, no blind spot, and the like. At present, the ways to realize electronic paper technology mainly include cholesterol liquid crystal display technology, electrophoretic display technology (EPD) and electrowetting display technology, among which electrophoretic display technology is regarded as the most promising technical approach.

SUMMARY

An aspect of the present disclosure provides an electronic paper display screen, comprising: a substrate, the substrate comprising a display region and a bonding region adjacent to the display region; an electronic paper, the electronic paper comprising a main portion in the display region of the substrate and an electronic ink conduction portion in the bonding region, the electronic ink conduction portion extending from a edge of the main portion close to the bonding region to the bonding region of the substrate; a bonding electrode in the bonding region of the substrate; and a chip-on-film electrically connected to the bonding electrode, an end of the chip-on-film close to the display region being sandwiched between the substrate and the electronic ink conduction portion.

According to some embodiments of the disclosure, the electronic paper comprises a base layer and a transparent electrode layer disposed on a side of the base layer away from the substrate, the base layer comprises a slot at the electronic ink conduction portion, and the transparent electrode layer is electrically connected to the chip-on-film through the slot.

According to some embodiments of the disclosure, the electronic ink conduction portion comprises a plurality of terminal electrodes spaced apart from each other, and the end of the chip-on-film close to the display region is sandwiched between the substrate and the plurality of terminal electrodes.

According to some embodiments of the disclosure, the electronic paper comprises a base layer and a transparent electrode layer disposed on a side of the base layer away from the substrate, the base layer comprises slots at the terminal electrodes, and the transparent electrode layer is electrically connected to the chip-on-film through the slots.

According to some embodiments of the disclosure, regions of the substrate corresponding to orthographic projections of the plurality of terminal electrodes on the substrate are hollowed out, and the chip-on-film is disposed in hollow regions of the substrate and spacing regions between respective terminal electrodes of the plurality of terminal electrodes.

According to some embodiments of the disclosure, the chip-on-film in the hollow regions and the chip-on-film in the spacing regions are not in a same plane and staggered with each other.

According to some embodiments of the disclosure, the slot is filled with a conductive adhesive, and the conductive adhesive is in contact with the transparent electrode layer.

According to some embodiments of the disclosure, the electronic paper display screen further comprises: a first protective film disposed on a side of the electronic paper away from the substrate, and a second protective film disposed on a side of the substrate away from the electronic paper, the first protective film and the second protective film are aligned and assembled to form a package.

According to some embodiments of the disclosure, the electronic paper display screen further comprises: a first sealant between the first protective film and the second protective film corresponding to the bonding region, and a second sealant at edges of the first protective film and the second protective film where they are assembled to form the package.

According to some embodiments of the disclosure, the substrate comprises a flexible substrate and the bonding electrode comprises a flexible bonding electrode.

Another aspect of the disclosure provides a method for fabricating an electronic paper display screen, comprising: providing an electronic paper on a substrate, the substrate comprising a display region and a bonding region adjacent to the display region, the electronic paper comprising a main portion in the display region and an electronic ink conduction portion in the bonding region, the electronic ink conduction portion extending from a edge of the main portion close to the bonding region to the bonding region of the substrate; providing a bonding electrode in the bonding region; providing a chip-on-film such that an end of the chip-on-film close to the display region is sandwiched between the substrate and the electronic ink conduction portion, and the chip-on-film is electrically connected to the bonding electrode.

According to some embodiments of the disclosure, the providing the electronic paper comprises: providing a base layer; providing a transparent electrode layer on a side of the base layer away from the substrate; and forming a slot in a region of the base layer corresponding to the electronic ink conduction portion, the transparent electrode layer being electrically connected to the chip-on-film through the slot.

According to some embodiments of the disclosure, the electronic ink conduction portion comprises a plurality of terminal electrodes spaced apart from each other, and the providing the electronic paper comprises: providing a base layer; providing a transparent electrode layer on a side of the base layer away from the substrate; and forming slots in regions of the base layer corresponding to the plurality of terminal electrodes, the transparent electrode layer being electrically connected to the chip-on-film through the slots.

According to some embodiments of the disclosure, the electronic paper display screen bonding method further comprises: filling the slot with a conductive adhesive.

Another aspect of the disclosure provides an electronic paper display device, comprising the electronic paper display screen according to any one of foregoing embodiments.

DETAILED DESCRIPTION

Embodiments of the disclosure provide an electronic paper display screen, a display device, and a bonding method, which can improve the substrate utilization rate for the electronic paper display screen and increase the yield and service life of the electronic paper display screen. To make the purpose, technical solutions and advantages of the disclosure clearer, the disclosure will be further described in detail below with reference to embodiments.

Electronic ink is a new liquid material that can be printed onto a surface of any material to display text or image information. Such electronic ink can be printed onto the surface of glass, fiber, or even a paper medium by means of a certain process to form electronic paper. Of course, these carriers carrying the electronic ink also require special processing. For example, it is required to construct a simple pixel control circuit therein for each pixel to enable the electronic ink to display desired images and texts. The electronic ink technology is able to make any surface an electronic paper display screen, which allows people to completely jump out of the concept of the original display device and slowly seeps into every corner of daily life.

Figure 1:
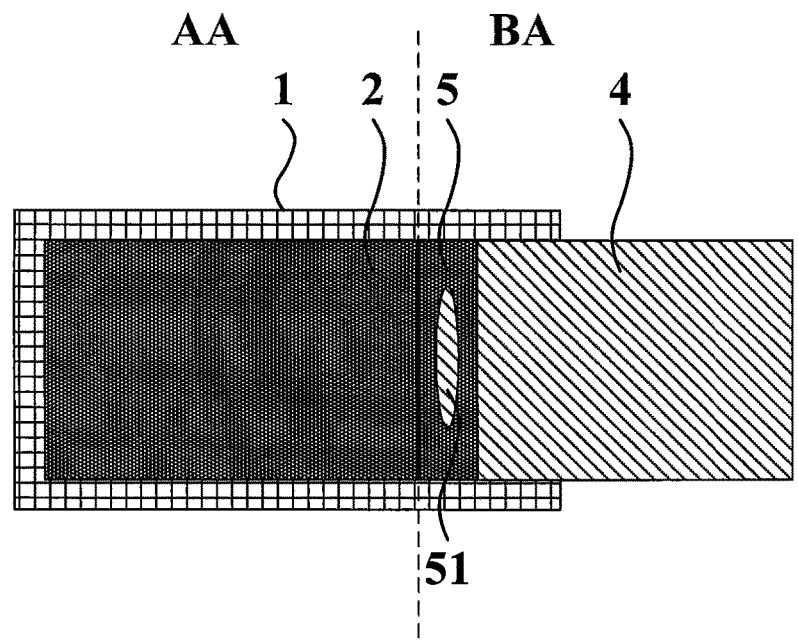
FIG. 1 is a schematic view of an electronic paper display screen provided by an embodiment of the present disclosure.
Figure 2:
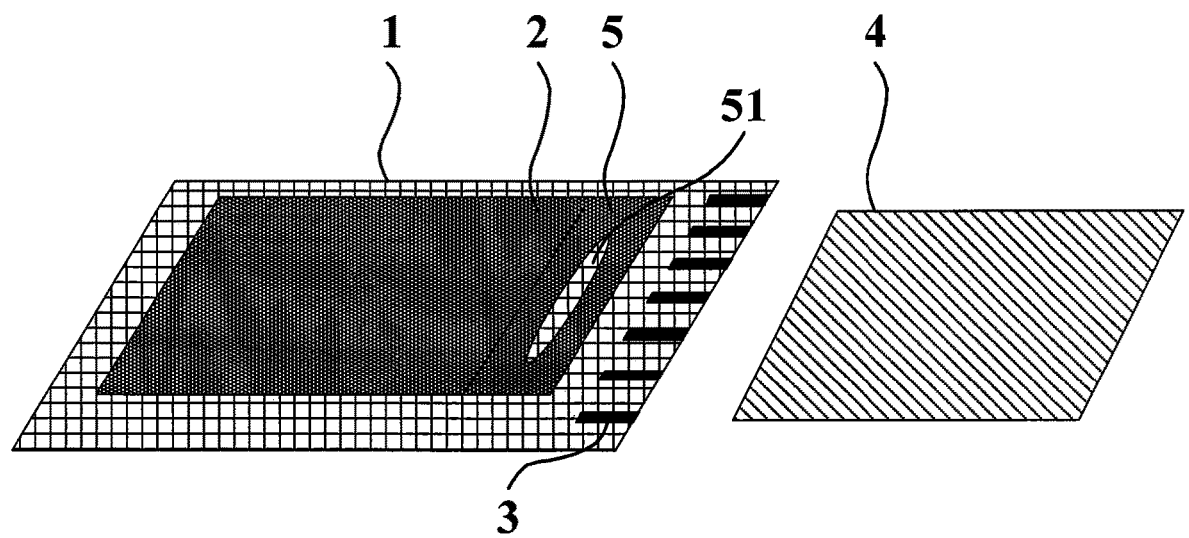
FIG. 2 is a schematic exploded view of an electronic paper display screen provided by an embodiment of the present disclosure.

However, the existing electronic paper display screen still has shortcomings such as slow response speed, slow conversion speed, complicated manufacturing process, being susceptible to the environment (factors such as moisture, oxygen, etc.), and the like, thereby causing a low yield, a poor display effect, and a short lifetime. Referring to FIG. 1 and FIG. 2, an electronic paper display screen provided by an embodiment of the disclosure comprises a substrate 1, an electronic paper, a bonding electrode 3, and a chip-on-film 4. The substrate 1 comprises a display region AA and a bonding region BA located at least on one side of the display region AA and adjacent to the display region AA. The electronic paper comprises a main portion 2 disposed in the display region AA of the substrate 1 and an electronic ink conduction portion 5 located at an edge of the main portion 2 close to the bonding region BA and extending to the bonding region BA of the substrate. The bonding region BA of the substrate 1 is provided with a bonding electrode 3, the chip-on-film 4 is electrically connected to the bonding electrode 3, and an end of the chip-on-film 4 close to the display region AA is sandwiched between the substrate 1 and the electronic ink conduction portion 5.

The chip-on-film technology generally refers to a technique of fixing a pixel control circuit for a pixel unit to a flexible substrate, in which an additional flexible circuit board is used as a package chip carrier to bond the package chip to the flexible substrate. Specifically, in an embodiment of the present disclosure, a pixel control circuit for driving a pixel unit of the electronic paper is fabricated on a flexible substrate to form the chip-on-film 4. The chip-on-film 4 supplies driving and control signals to the electronic paper through the bonding electrode 3 and the electronic ink conduction portion 5.

In the electronic paper display screen provided by the embodiment of the disclosure, the electronic paper in the bonding region is provided with an electronic ink conduction portion, and an end of the chip-on-film close to the display region is sandwiched between the substrate and the electronic ink conduction portion, so that the electronic paper is able to electrically connect to the chip-on-film and the bonding electrode on the substrate through the electronic ink conduction portion. Compared to a technical approach in which a pixel control circuit for driving a pixel unit is typically disposed in a non-display region of a substrate, in the embodiment of the disclosure, by providing a chip-on-film comprising a pixel control circuit and sandwiching an end of the chip-on-film close to the display region between the substrate and the electronic ink conduction portion, the substrate utilization rate and internal structural stability of the electronic paper display screen can be improved, thereby increasing the yield and service life of the electronic paper display screen.

The electronic paper mentioned in the embodiment of the disclosure is a main display element in the electronic paper display screen. The electronic paper may be a film with an electronic ink coating on the surface thereof. Hundreds of microcapsules having sizes similar to the diameters of the human hairs are suspended in the electronic ink coating, each microcapsule being composed of positively charged particles and negatively charged particles. With the pixel control circuit in the chip-on-film, the electronic paper can perform image display by allocating the above-mentioned large number of microcapsules into different pixel units.

Figure 9:
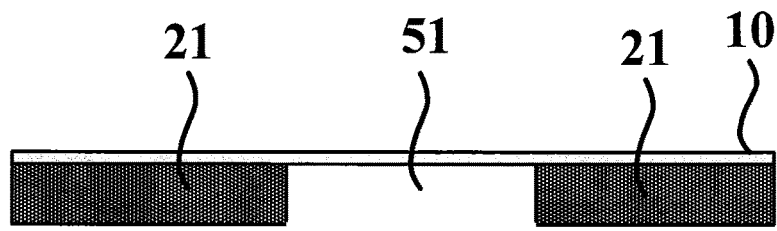
FIG. 9 is a sectional view of an electronic paper provided by an embodiment of the present disclosure.

In an exemplary embodiment, referring to FIGS. 1, 2 and 9, the electronic paper (including the main portion 2 and the electronic ink conduction portion 5) of the electronic paper display screen is provided with a transparent electrode layer 10 on a side (the top side in the orientations of FIGS. 1, 2 and 9) away from the substrate 1, and the electronic ink conduction portion 5 has a slot 51. That is, as shown in FIG. 9, the electronic paper comprises a base layer 21 and the transparent electrode layer 10 disposed on the surface of the base layer 21, and the slot 51 is disposed in a portion of the base layer 21 of the electronic ink conduction portion 5. The slot 51 is formed in the electronic ink conduction portion 5 of the electronic paper. On the one hand, the electronic paper can be electrically connected to the chip-on-film 4 by filling the slot 51 with a conductive material, and on the other hand, the electronic paper can be fixed by the conductive material filled in the slot 51. Therefore, the presence of the slot 51 can provide both a fixed point and a conduction point for the electronic paper display screen, thereby further improving the substrate utilization rate of the electronic paper display screen.

Figure 3:
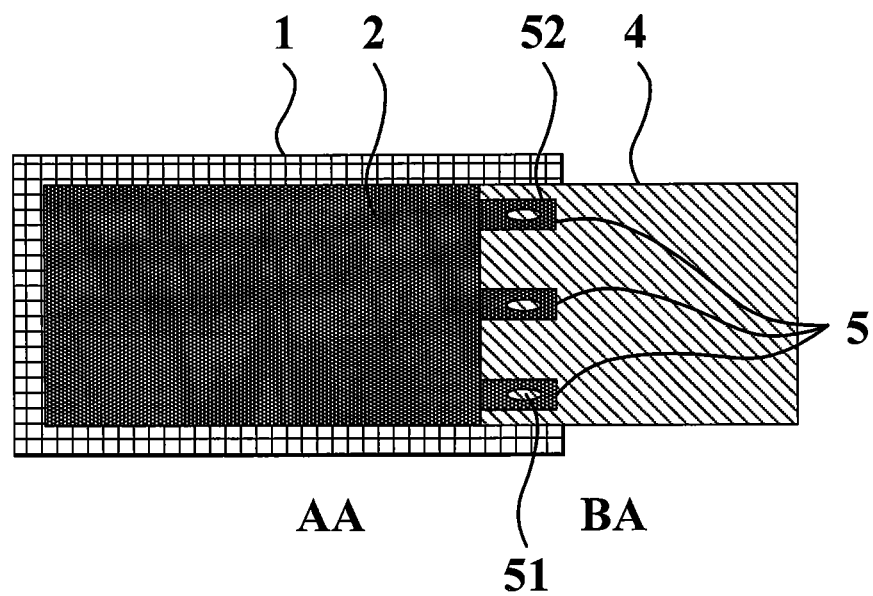
FIG. 3 is a schematic view of an electronic paper display screen provided by another embodiment of the present disclosure.

In another embodiment of the present disclosure, as shown in FIG. 3, the electronic ink conduction portion 5 of the electronic paper display screen comprises a plurality of terminal electrodes 52 spaced apart from each other, and the end of the chip-on-film 4 close to the display region AA is sandwiched between the substrate 1 and the plurality of terminal electrodes 52. In this embodiment, by providing the electronic ink conduction portion in the form of a plurality of terminal electrodes, the chip-on-film can be clamped by the plurality of terminal electrodes and the substrate, so that the structural stability of the electronic paper display screen can be further enhanced on the basis of improving the substrate utilization rate, so as to increase the yield and service life of the electronic paper display screen.

As will be appreciated by those skilled in the art, in the present disclosure, disposing the terminal electrodes 52 shown in FIG. 3 on one side of the electronic paper is just an example and is not to be construed as limiting the present disclosure. In other embodiments, the terminal electrodes may be selectively disposed depending on the orientation of the bonding region BA of the electronic paper display screen. For example, as shown in FIG. 4, the electronic paper is provided with a bonding region BA on both the left and right sides of the display region AA, and a plurality of terminal electrodes 52 are disposed in both of the bonding regions BA.

Figure 4:
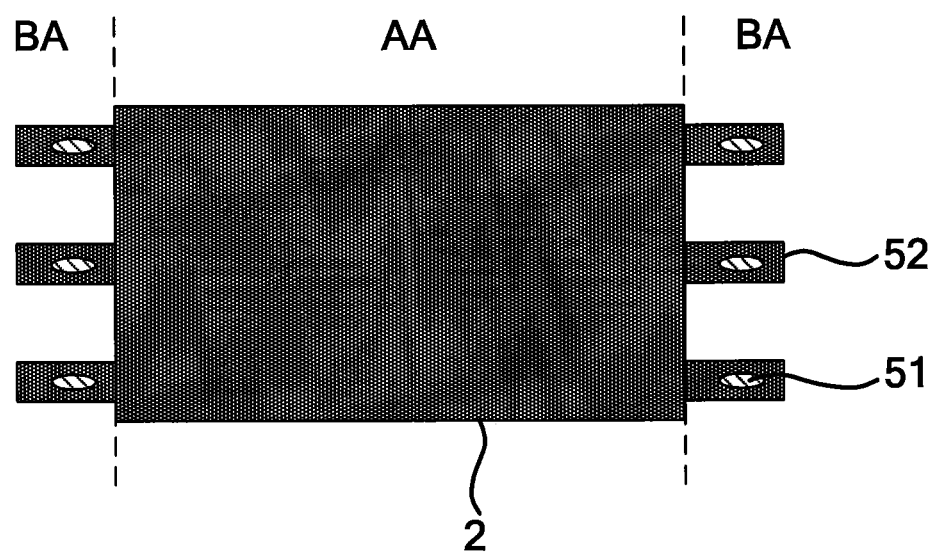
FIG. 4 is a top view of an electronic paper provided by an embodiment of the present disclosure.
Figure 7:
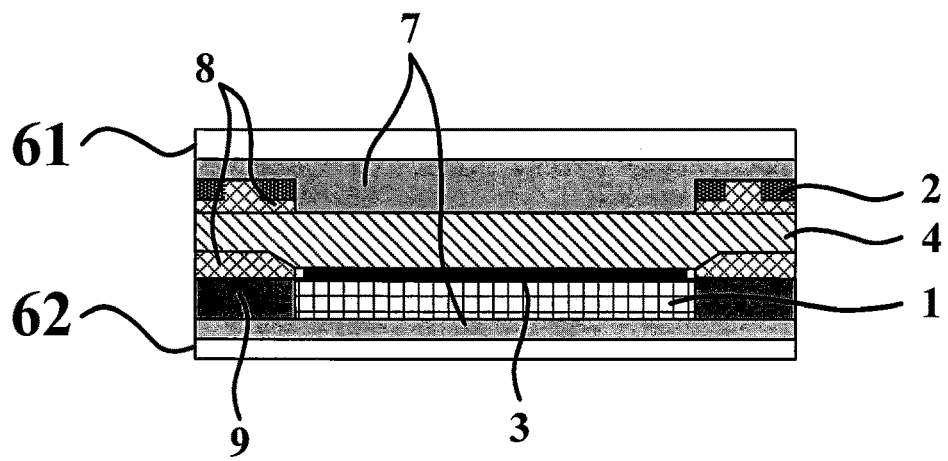
FIG. 7 is a sectional view of the electronic paper display screen shown in FIG. 6 taken along the line a-a.

In an embodiment of the disclosure, referring to FIG. 3, FIG. 4 and FIG. 9, the electronic paper (including the terminal electrodes 52) of the electronic paper display screen is provided with a transparent electrode layer 10 on a side away from the substrate 1, and each terminal electrode 52 is provided with a slot 51. As shown in FIGS. 7 and 9, the slot 51 of the electronic paper display screen is filled with a conductive material such as a conductive adhesive 8. The electronic paper comprises a base layer 21 and the transparent electrode layer 10 disposed on the surface of the base layer 21. In order to bring the electronic paper into conduction with the transparent electrode layer on the terminal electrode, a slot may be formed in the base layer 21 at the terminal electrode, and filled with a conductive material, which can provide both a fixed point and a conduction point for the electronic paper display screen, further improving the substrate utilization rate of the electronic paper display screen.

Figure 5:
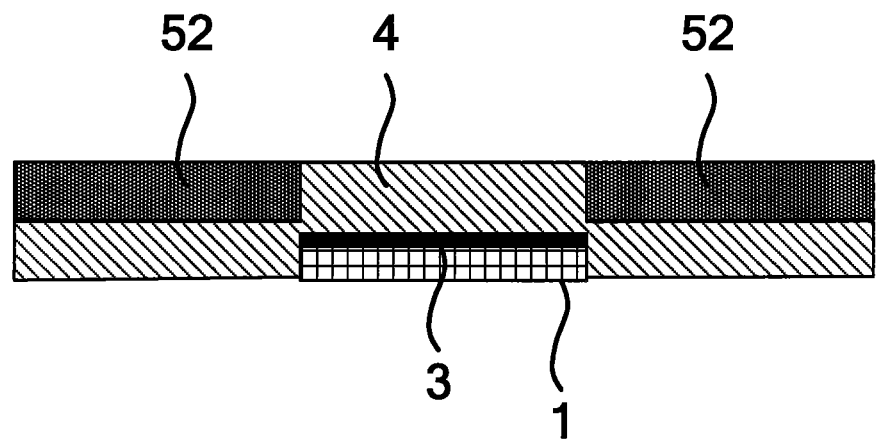
FIG. 5 is a view illustrating that a chip-on-film of the electronic paper display screen provided by another embodiment of the disclosure is arranged in a stepwise manner.

In an exemplary embodiment, referring to FIG. 5, regions of the substrate 1 corresponding to the orthographic projections of the plurality of terminal electrodes 52 on the substrate 1 are hollowed out, the chip-on-film 4 is disposed in the hollow regions of the substrate 1 and spacing regions between the plurality of terminal electrodes 52, and the chip-on-films 4 in the hollow region and the spacing region are not in the same plane. In this embodiment, the plurality of terminal electrodes in the electronic ink conduction portion are woven with the substrate in a crisscross manner to thereby clamp the chip-on-film and enable the chip-on-films in the hollow region and the spacing region to be arranged in a stepwise manner, which can further enhance the stability of clamping the chip-on-film by the plurality of terminal electrodes and the substrate, and improve the space utilization rate inside the electronic paper display screen, thereby increasing the substrate utilization rate, yield and service life of the electronic paper display screen according to an embodiment of the present disclosure.

In the electronic paper display screen provided by an embodiment of the present disclosure, referring to FIG. 7 and FIG. 9, the slot 51 of the electronic paper display screen is filled with a conductive adhesive 8, and the conductive adhesive 8 is in contact with the transparent electrode layer 10 at the slot 51. A flexible printed circuit board 9 is disposed on a side of the chip-on-film 4. The conductive adhesive enables the electronic paper to be electrically connected to the chip-on-film through the electronic ink conduction portion, and the bonding electrode on the substrate is electrically connected to the chip-on-film.

Figure 6:
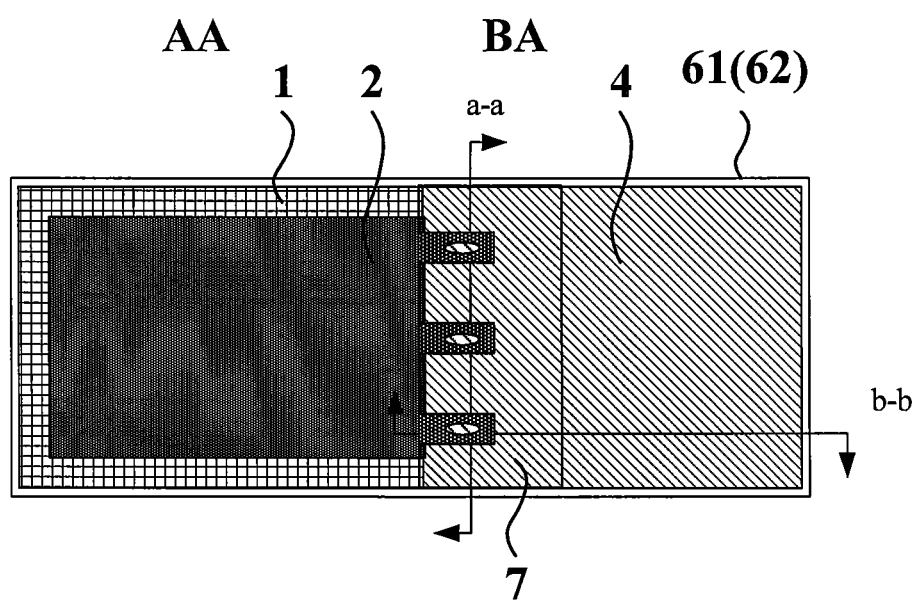
FIG. 6 is a top view of an electronic paper display screen provided by an embodiment of the present disclosure.
Figure 8:
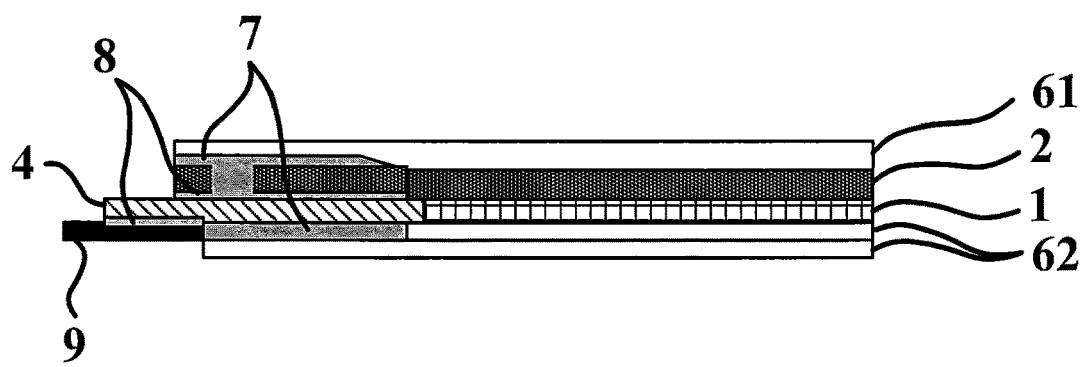
FIG. 8 is a sectional view of the electronic paper display screen shown in FIG. 6 taken along the line b-b.

Referring to FIG. 6, FIG. 7 and FIG. 8, FIG. 7 is a sectional view of the electronic paper display screen shown in FIG. 6 taken along the line a-a, and FIG. 8 which is a sectional view of the electronic paper display screen shown in FIG. 6 taken along the line b-b. A first protective film 61 is attached to a surface of the electronic paper of the electric paper display screen according to an embodiment of the disclosure away from the substrate 1, a second protective film 62 is attached to a surface of the substrate 1 away from the electronic paper, and the first protective film 61 and the second protective film 62 are aligned and assembled to form a package. The material of the protective film is not specifically limited in the present disclosure. For example, a transparent organic resin material may be employed to effectively protect the electronic paper display screen and fix the package. Moreover, the second protective film of the electronic paper display screen of the disclosure may employ a bilayer protective film to further improve the packaging effect of the electronic paper display screen of the present disclosure, and to prevent the influence of external moisture and oxygen on internal components. Further, in an embodiment, the space between the first protective film 61 and the second protective film 62 corresponding to the bonding region BA is filled with a sealant 7, and edges of the first protective film 61 and the second protective film 62 where they are assembled to form a package are filled with a sealant 7. The sealant further enhances the structural stability and sealing property of the electronic paper display screen according to embodiments of the present disclosure. The substrate in the electronic paper display screen may be a flexible substrate, and the bonding electrode may be a flexible bonding electrode, so that the formed electronic paper display screen has a flexibly bendable function and can be applied to the application scenarios for a flexible display screen. It is to be noted that although the sealant 7 is illustrated as being transparent in FIG. 6, this is merely for convenience of illustration and is not a limit to the sealant 7.

Figure 10:
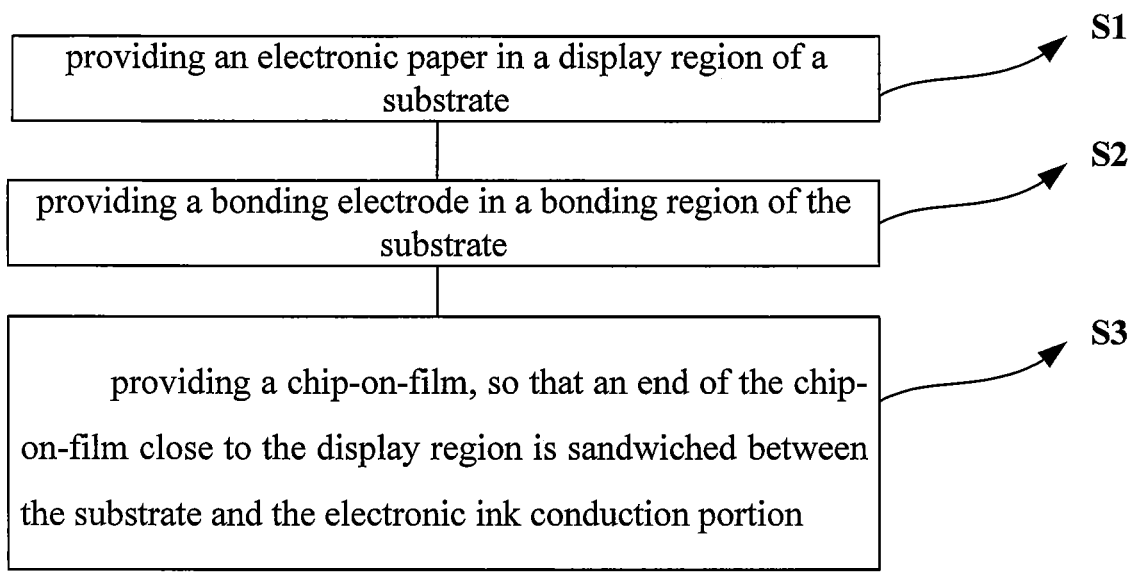
FIG. 10 is a flow chart of an electronic paper display screen bonding method provided by an embodiment of the disclosure.

An embodiment of the disclosure further provides an electronic paper display screen bonding method. As shown in FIG. 10, at step S1, an electronic paper is provided in a display region of a substrate. The electronic paper comprises an electronic ink conduction portion close to an edge of a bonding region of the substrate, the bonding region is located on at least one side of the display region and adjacent to the display region. At step S2, a bonding electrode is provided in the bonding region. At step S3, a chip-on-film is provided so that an end of the chip-on-film close to the display region is sandwiched between the substrate and the electronic ink conduction portion, and the chip-on-film is electrically connected to the bonding electrode.

In an exemplary embodiment, providing an electronic paper may further comprise: providing a base layer; providing a transparent electrode layer on a side of the base layer away from the substrate; and forming a slot in a region of the base layer corresponding to the electronic ink conduction portion. The transparent electrode layer is electrically connected to the chip-on-film through the slot.

In an exemplary embodiment, the electronic ink conduction portion comprises a plurality of terminal electrodes spaced apart from each other.

Providing an electronic paper may comprise: providing a base layer; providing a transparent electrode layer on a side of the base layer away from the substrate; and forming slots in regions of the base layer corresponding to the plurality of terminal electrodes. The transparent electrode layer is electrically connected to the chip-on-film through the slots.

In an exemplary embodiment, the above electronic paper display screen bonding method may further comprise: filling the slot with a conductive adhesive.

In case the electronic paper display screen bonding method provided by the embodiment of the present disclosure is applied to the electronic paper display screen described above, the substrate utilization rate of the electronic paper display screen product can be improved, and the yield and service life of the electronic paper display screen can be increased.

An embodiment of the disclosure further provides an electronic paper display device comprising the electronic paper display screen described above. By including the above-described electronic paper display screen in the electronic paper display device provided by the embodiment of the disclosure, the substrate utilization rate of the electronic paper display device can be improved, and the yield and service life of the electronic paper display device can be increased.

It is apparent that those skilled in the art can make various modifications and variations to the embodiments of the present disclosure without departing from the spirit and scope of the present disclosure. Thus, if these modifications and variations to the present disclosure fall within the scope of the claims of the present disclosure and equivalent technologies thereof, the present disclosure is also intended to encompass these modifications and variations.

The invention claimed is:

1. An electronic paper display screen, comprising:
a substrate comprising a display region and a bonding region adjacent to the display region;
an electronic paper comprising a main portion in the display region of the substrate and an electronic ink conduction portion in the bonding region, the electronic ink conduction portion extending from an edge of the main portion close to the bonding region of the substrate to the bonding region of the substrate;
a bonding electrode in the bonding region of the substrate; and
a chip-on-film electrically connected to the bonding electrode,
wherein an end of the chip-on-film close to the display region is between the substrate and the electronic ink conduction portion,
wherein the electronic paper comprises a base layer and a transparent electrode layer on a side of the base layer away from the substrate,
wherein the base layer comprises a slot at the electronic ink conduction portion, and wherein the transparent electrode layer is electrically connected to the chip-on-film through the slot.

2. An electronic paper display screen, comprising:
a substrate comprising a display region and a bonding region adjacent to the display region;
an electronic paper comprising a main portion in the display region of the substrate and an electronic ink conduction portion in the bonding region, the electronic ink conduction portion extending from an edge of the main portion close to the bonding region of the substrate to the bonding region of the substrate;
a bonding electrode in the bonding region of the substrate; and
a chip-on-film electrically connected to the bonding electrode,
wherein an end of the chip-on-film close to the display region is between the substrate and the electronic ink conduction portion,
wherein the electronic ink conduction portion comprises a plurality of terminal electrodes spaced apart from each other, and
wherein the end of the chip-on-film close to the display region is between the substrate and the plurality of terminal electrodes.

3. The electronic paper display screen according to claim 2,
wherein the electronic paper comprises a base layer and a transparent electrode layer on a side of the base layer away from the substrate,
wherein the base layer comprises slots at the terminal electrodes, and
wherein the transparent electrode layer is electrically connected to the chip-on-film through the slots.

4. The electronic paper display screen according to claim 2,
wherein regions of the substrate corresponding to orthographic projections of the plurality of terminal electrodes on the substrate are hollowed out, and
wherein the chip-on-film is in hollow regions of the substrate and in spacing regions between respective terminal electrodes of the plurality of terminal electrodes.

5. The electronic paper display screen according to claim 4, wherein the chip-on-film in the hollow regions and the chip-on-film in the spacing regions are not in a same plane and are staggered with each other.

6. The electronic paper display screen according to claim 1, wherein the slot contains a conductive adhesive, and the conductive adhesive is in contact with the transparent electrode layer.

7. The electronic paper display screen according to claim 1, further comprising:
a first protective film on a side of the electronic paper away from the substrate, and
a second protective film on a side of the substrate away from the electronic paper,
wherein the first protective film and the second protective film are aligned and assembled to form a package.

8. The electronic paper display screen according to claim 7, wherein the electronic paper display screen further comprises:
a first sealant between the first protective film and the second protective film corresponding to the bonding region; and
a second sealant at edges of the first protective film and the second protective film that are assembled to form the package.

9. The electronic paper display screen according to claim 1,
wherein the substrate comprises a flexible substrate, and
wherein the bonding electrode comprises a flexible bonding electrode.

10. A method for fabricating the electronic paper display screen according to claim 1, comprising:
providing the electronic paper on the substrate, the substrate comprising the display region and the bonding region adjacent to the display region, the electronic paper comprising the main portion in the display region and the electronic ink conduction portion in the bonding region, the electronic ink conduction portion extending from the edge of the main portion of the electronic paper close to the bonding region to the bonding region of the substrate;
providing the bonding electrode in the bonding region; and
providing the chip-on-film such that the end of the chip-on-film close to the display region is between the substrate and the electronic ink conduction portion,
wherein the chip-on-film is electrically connected to the bonding electrode.

11. A method for fabricating an electronic paper display screen, comprising:
providing an electronic paper on a substrate, the substrate comprising a display region and a bonding region adjacent to the display region, the electronic paper comprising a main portion in the display region and an electronic ink conduction portion in the bonding region, the electronic ink conduction portion extending from a edge of the main portion of the electronic paper close to the bonding region to the bonding region of the substrate;
providing a bonding electrode in the bonding region; and
providing a chip-on-film such that an end of the chip-on-film close to the display region is between the substrate and the electronic ink conduction portion,
wherein the chip-on-film is electrically connected to the bonding electrode, and
wherein the providing the electronic paper comprises:
providing a base layer;
providing a transparent electrode layer on a side of the base layer away from the substrate; and
forming a slot in a region of the base layer corresponding to the electronic ink conduction portion,
wherein the transparent electrode layer is configured to be electrically connected to the chip-on-film through the slot.

12. The method according to claim 10, wherein the electronic ink conduction portion comprises a plurality of terminal electrodes spaced apart from each other, and the providing the electronic paper comprises:
providing a base layer;
providing a transparent electrode layer on a side of the base layer away from the substrate; and
forming slots in regions of the base layer corresponding to the plurality of terminal electrodes,
wherein the transparent electrode layer is configured to be electrically connected to the chip-on-film through the slots.

13. The method according to claim 11, further comprising:
depositing a conductive adhesive in the slot.

14. An electronic paper display device, comprising the electronic paper display screen according to claim 1.

15. The electronic paper display screen according to claim 3,
wherein the slots contain a conductive adhesive, and
wherein the conductive adhesive is in contact with the transparent electrode layer.

16. The electronic paper display device according to claim 14,
wherein the electronic paper comprises a base layer and a transparent electrode layer disposed on a side of the base layer away from the substrate,
wherein the base layer comprises a slot at the electronic ink conduction portion, and
wherein the transparent electrode layer is electrically connected to the chip-on-film through the slot.

17. The electronic paper display device according to claim 14,
wherein the electronic ink conduction portion comprises a plurality of terminal electrodes spaced apart from each other, and
wherein the end of the chip-on-film close to the display region is between the substrate and the plurality of terminal electrodes.

18. The electronic paper display device according to claim 17,
wherein the electronic paper comprises a base layer and a transparent electrode layer disposed on a side of the base layer away from the substrate,
wherein the base layer comprises slots at the terminal electrodes, and the transparent electrode layer is electrically connected to the chip-on-film through the slots.

19. The electronic paper display device according to claim 17,
wherein regions of the substrate corresponding to orthographic projections of the plurality of terminal electrodes on the substrate are hollowed out, and
wherein the chip-on-film is disposed in hollow regions of the substrate and in spacing regions between respective terminal electrodes of the plurality of terminal electrodes.

20. The method according to claim 10, wherein the providing the electronic paper comprises:
providing a base layer;
providing a transparent electrode layer on a side of the base layer away from the substrate; and
forming a slot in a region of the base layer corresponding to the electronic ink conduction portion,
wherein the transparent electrode layer is configured to be electrically connected to the chip-on-film through the slot.

* * * * *